US010468535B2

(12) United States Patent
Morita et al.

(10) Patent No.: US 10,468,535 B2
(45) Date of Patent: *Nov. 5, 2019

(54) OXIDE FOR SEMICONDUCTOR LAYER OF THIN FILM TRANSISTOR, SPUTTERING TARGET, AND THIN FILM TRANSISTOR

(75) Inventors: Shinya Morita, Kobe (JP); Toshihiro Kugimiya, Kobe (JP); Takeaki Maeda, Kobe (JP); Satoshi Yasuno, Kobe (JP); Yasuaki Terao, Kobe (JP); Aya Miki, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 1050 days.

This patent is subject to a terminal disclaimer.

(21) Appl. No.: 13/636,255

(22) PCT Filed: Apr. 7, 2011

(86) PCT No.: PCT/JP2011/058847

§ 371 (c)(1),
(2), (4) Date: Sep. 20, 2012

(87) PCT Pub. No.: WO2011/126093

PCT Pub. Date: Oct. 13, 2011

(65) Prior Publication Data

US 2013/0009111 A1 Jan. 10, 2013

(30) Foreign Application Priority Data

Apr. 7, 2010 (JP) .................. 2010-088725
Nov. 15, 2010 (JP) .................. 2010-255249
Jan. 18, 2011 (JP) .................. 2011-008322

(51) Int. Cl.
*C23C 14/34* (2006.01)
*H01L 29/786* (2006.01)
(Continued)

(52) U.S. Cl.
CPC .......... *H01L 29/7869* (2013.01); *C23C 14/08* (2013.01); *C23C 14/3414* (2013.01);
(Continued)

(58) Field of Classification Search
CPC ............... C23C 14/08; C23C 14/3414; H01L 21/02554; H01L 21/02565; H01L 21/02631; H01L 29/7869
(Continued)

(56) References Cited

U.S. PATENT DOCUMENTS 5,622,653 A * 4/1997 Orita et al. .............. 252/519.1
8,242,504 B2 8/2012 Kim et al.
(Continued)

FOREIGN PATENT DOCUMENTS

CN 101333644 A 12/2008
JP 2006-165529 6/2006
(Continued)

OTHER PUBLICATIONS

International Search Report dated Jul. 5, 2011 in PCT/JP11/58847 Filed Apr. 7, 2011.
(Continued)

*Primary Examiner* — Rodney G McDonald
(74) *Attorney, Agent, or Firm* — Oblon, McClelland, Maier & Neustadt, L.L.P.

(57) ABSTRACT

Disclosed is an oxide for a semiconductor layer of a thin film transistor, which, when used in a thin film transistor that includes an oxide semiconductor in the semiconductor layer, imparts good switching characteristics and stress resistance to the transistor. Specifically disclosed is an oxide for a semiconductor layer of a thin film transistor, which is used for a semiconductor layer of a thin film transistor and contains at least one element selected from the group consisting of In, Ga and Zn and at least one element selected from the group X consisting of Al, Si, Ni, Ge, Sn, Hf, Ta and W.

6 Claims, 9 Drawing Sheets

(51) Int. Cl.
*H01L 21/02* (2006.01)
*C23C 14/08* (2006.01)

(52) U.S. Cl.
CPC .. *H01L 21/02554* (2013.01); *H01L 21/02565* (2013.01); *H01L 21/02631* (2013.01)

(58) Field of Classification Search
USPC .................................................. 204/298.13
See application file for complete search history.

(56) References Cited

U.S. PATENT DOCUMENTS

| | | | |
|---|---|---|---|
| 8,304,359 B2* | 11/2012 | Yano et al. ................ 501/126 |
| 8,383,019 B2* | 2/2013 | Yano et al. ................ 252/520.1 |
| 8,623,511 B2* | 1/2014 | Kawashima et al. ......... 428/412 |
| 8,753,548 B2* | 6/2014 | Yano et al. .............. 252/519.51 |
| 2009/0308635 A1 | 12/2009 | Yano et al. |
| 2010/0025674 A1 | 2/2010 | Kim et al. |
| 2010/0032666 A1 | 2/2010 | Yamazaki et al. |
| 2010/0108502 A1 | 5/2010 | Inoue et al. |
| 2010/0155717 A1 | 6/2010 | Yano et al. |
| 2010/0266787 A1 | 10/2010 | Yano et al. |
| 2010/0295042 A1 | 11/2010 | Yano et al. |
| 2011/0001136 A1 | 1/2011 | Hasegawa et al. |
| 2011/0121244 A1 | 5/2011 | Yano et al. |
| 2011/0240988 A1* | 10/2011 | Yano et al. ..................... 257/43 |
| 2011/0260118 A1 | 10/2011 | Yano et al. |
| 2011/0260121 A1 | 10/2011 | Yano et al. |
| 2013/0248858 A1* | 9/2013 | Morita et al. ................... 257/43 |
| 2013/0270109 A1 | 10/2013 | Morita et al. |
| 2014/0054588 A1 | 2/2014 | Maeda et al. |

FOREIGN PATENT DOCUMENTS

| | | |
|---|---|---|
| JP | 2007-123699 A | 5/2007 |
| JP | 2008-141113 | 6/2008 |
| JP | 2008-280216 A | 11/2008 |
| JP | 2009 253204 | 10/2009 |
| JP | 2009-275272 | 11/2009 |
| JP | 2010 30824 | 2/2010 |
| JP | 2010-272663 | 12/2010 |
| KR | 10-2010-0013717 | 2/2010 |
| TW | 200941729 A1 | 10/2009 |
| WO | WO 2007/034733 * | 3/2007 |
| WO | WO 2007/037191 * | 4/2007 |
| WO | 2009 093625 | 7/2009 |
| WO | WO 2009148154 * | 10/2009 |
| WO | WO 2009/142289 A1 | 11/2009 |
| WO | 2010 023889 | 3/2010 |

OTHER PUBLICATIONS

U.S. Appl. No. 14/113,322, filed Oct. 22, 2013, Maeda, et al.
U.S. Appl. No. 14/399,378, filed Nov. 6, 2014, Goto, et al.

* cited by examiner

OXIDE FOR SEMICONDUCTOR LAYER OF THIN FILM TRANSISTOR, SPUTTERING TARGET, AND THIN FILM TRANSISTOR

TECHNICAL FIELD

The present invention relates to an oxide for a semiconductor layer of a thin film transistor used in a display device, such as a liquid crystal display or an organic EL display, and also relates to a sputtering target for depositing the oxide, and a thin film transistor.

BACKGROUND ART

Amorphous (non-crystalline) oxide semiconductors have high carrier mobility and a high optical bandgap and can be formed at a low temperature compared with widely used amorphous silicon (a-Si), and thus are expected to be applied to next-generation displays which are required to be large, have high resolution, and be operated at high speed, resin substrates having low heat resistance, and the like.

Among oxide semiconductors, in particular, amorphous oxide semiconductors composed of indium, gallium, zinc, and oxygen (In—Ga—Zn—O, hereinafter, may be referred to as "IGZO") have very high carrier mobility, and therefore, are favorably used. For example, Non-Patent Literatures 1 and 2 each disclose an example in which an oxide semiconductor thin film containing In, Ga, and Zn at a ratio of 1.1:1.1:0.9 (at %) is used as a semiconductor layer (active layer) in a thin film transistor (TFT). Furthermore, Patent Literature 1 discloses an amorphous oxide which contains elements, such as In, Zn, Sn, and Ga, and Mo and in which the atomic composition ratio of Mo to the number of total metal atoms in the amorphous oxide is 0.1 to 5 at %, and discloses in an example thereof a TFT including an active layer in which Mo is added to IGZO.

CITATION LIST

Patent Literature

PTL 1: Japanese Unexamined Patent Application Publication No. 2009-164393

Non Patent Literature

NPL 1: Kotai Butsuri, VOL 44, P 621(2009)
NPL 2: Nature, VOL 432, P 488(2004)

SUMMARY OF INVENTION

Technical Problem

When an oxide semiconductor is used for a semiconductor layer of a thin film transistor, not only a high carrier concentration, but also excellent TFT switching characteristics (transistor characteristics) are required. Specifically, examples of the requirements include (1) a high on-state current (maximum drain current flowing when a positive voltage is applied to a gate electrode and a drain electrode), (2) a low off-state current (drain current flowing when a negative voltage is applied to a gate electrode and a positive voltage is applied to a drain voltage), (3) a low SS (sub-threshold swing; a gate voltage required for increasing the drain current by one order of magnitude) value, and (4) a stable threshold (voltage at which a drain current starts to flow when a positive voltage is applied to a drain electrode and a positive or negative voltage is applied to a gate voltage; also referred to as a "threshold voltage") which does not change with time (i.e., which is uniform in a substrate plane). The present inventors have studied the characteristics of the IGZO semiconductor containing Mo described in Patent Literature 1. As a result, it has been found that a decrease in the on-state current and an increase in the SS value are observed compared with IGZO.

Furthermore, a TFT including an oxide semiconductor layer composed of IGZO or the like is required to have excellent resistance (stress resistance) to stress, such as that caused by application of a voltage or light irradiation. For example, when a positive voltage or a negative voltage is continuously applied to a gate voltage or when irradiation of light in the blue band, in which light absorption starts, is continuously performed, the threshold voltage shifts markedly. It has been pointed out that this causes a change in switching characteristics of the TFT. Furthermore, when a liquid crystal panel is operated or a pixel is lit by application of a negative bias to a gate electrode, light leaking from the liquid crystal cell may be applied to a TFT. Such light imparts stress to the TFT, resulting in degradation in the characteristics. In particular, a shift in the threshold voltage may lead to a decrease in the reliability of a display device, such as a liquid crystal display or an organic EL display, provided with TFTs. Therefore, it has been desired that stress resistance be improved (the amount of change before and after application of stress be small).

The present invention has been achieved under the circumstances described above, and it is an object of the present invention to provide an oxide for a semiconductor layer of a thin film transistor, which, when used in a thin film transistor that includes an oxide semiconductor, imparts good switching characteristics and stress resistance to the transistor, in which, in particular, the amount of change in the threshold voltage before and after application of stress is small, and excellent stability is exhibited, and to provide a sputtering target used for depositing the oxide, and a thin film transistor fabricated using the oxide.

Solution to Problem

The present invention includes the following embodiments.

(1) An oxide for a semiconductor layer of a thin film transistor, which is used for a semiconductor layer of a thin film transistor, the oxide containing at least one element selected from the group consisting of In, Ga, and Zn; and at least one element selected from the group X consisting of Al, Si, Ni, Ge, Sn, Hf, Ta, and W.

(2) The oxide according to item (1), in which, when the oxide contains Al as the element of the group X, Al/(In+Ga+Zn+Al)×100=0.1 to 10 at %;

when the oxide contains Si as the element of the group X, Si/(In+Ga+Zn+Si)×100=0.1 to 15 at %;

when the oxide contains Ni as the element of the group X, Ni/(In+Ga+Zn+Ni)×100=0.1 to 5 at %;

when the oxide contains Ge as the element of the group X, Ge/(In+Ga+Zn+Ge)×100=0.1 to 10 at %;

when the oxide contains Sn as the element of the group X, Sn/(In+Ga+Zn+Sn)×100=0.1 to 15 at %;

when the oxide contains Hf as the element of the group X, Hf/(In+Ga+Zn+Hf)×100=0.1 to 10 at %;

when the oxide contains Ta as the element of the group X, Ta/(In+Ga+Zn+Ta)×100=0.1 to 10 at %; and when the oxide contains W as the element of the group X, W/(In+Ga+Zn+W)×100=0.1 to 10 at %.

(3) A thin film transistor including the oxide according to item (1) or (2) for a semiconductor layer of the thin film transistor.

(4) The thin film transistor according to item (3), in which the semiconductor layer has a density of 5.8 g/cm$^3$ or more.

(5) A sputtering target for forming the oxide according to item (1) or (2), which contains at least one element selected from the group consisting of In, Ga, and Zn; and at least one element selected from the group X consisting of Al, Si, Ni, Ge, Sn, Hf, Ta, and W.

(6) The sputtering target according to item (5), in which, when the sputtering target contains Al as the element of the group X, Al/(In+Ga+Zn+Al)×100=0.1 to 10 at %;

when the sputtering target contains Si as the element of the group X, Si/(In+Ga+Zn+Si)×100=0.1 to 15 at %;

when the sputtering target contains Ni as the element of the group X, Ni/(In+Ga+Zn+Ni)×100=0.1 to 5 at %;

when the sputtering target contains Ge as the element of the group X, Ge/(In+Ga+Zn+Ge)×100=0.1 to 10 at %;

when the sputtering target contains Sn as the element of the group X, Sn/(In+Ga+Zn+Sn)×100=0.1 to 15 at %;

when the sputtering target contains Hf as the element of the group X, Hf/(In+Ga+Zn+Hf)×100=0.1 to 10 at %;

when the sputtering target contains Ta as the element of the group X, Ta/(In+Ga+Zn+Ta)×100=0.1 to 10 at %; and when the sputtering target contains W as the element of the group X, W/(In+Ga+Zn+W)×100=0.1 to 10 at %.

Advantageous Effects of Invention

The oxide of the present invention imparts good switching characteristics and stress resistance, in particular, a small change in threshold voltage after application of stress, to a thin film transistor. Therefore, it is possible to provide a thin film transistor having excellent TFT characteristics and stress resistance. Consequently, by using the thin film transistor, a highly reliable display device can be obtained.

DESCRIPTION OF EMBODIMENTS

The present inventors have performed thorough studies in order to improve TFT characteristics and stress resistance when an oxide (IGZO) containing at least one element selected from the group consisting of In, Ga, and Zn is used for an active layer (semiconductor layer) of a TFT. As a result, it has been found that when IGZO-X, in which at least one element selected from the group X consisting of Al, Si, Ni, Ge, Sn, Hf, Ta, and W is incorporated into IGZO, is used for a semiconductor layer of a TFT, the desired object can be achieved. Thus, the present invention has been completed. As is obvious from Examples, which will be described later, a TFT including an oxide semiconductor containing an element belonging to the group X (group X element) has excellent TFT characteristics and stress resistance compared with the case where Mo described in Patent Literature 1 or an element other than the group X element is used.

That is, an oxide for a semiconductor layer of a thin film transistor (TFT) according to the present invention is characterized by containing at least one element selected from the group consisting of In, Ga, and Zn; and at least one element selected from the group X consisting of Al, Si, Ni, Ge, Sn, Hf, Ta, and W (which may be represented by a group X element). In this description, the oxide of the present invention may be expressed as "IGZO-X" in some cases.

First, metals (In, Ga, and Zn) which are base materials constituting the oxide of the present invention will be described.

Note that the IGZO oxide usually exists as an oxide in which metal atoms of In, Ga, and Zn are uniformly mixed, or the oxide may locally contain oxides, such as $In_2O_3$, $Ga_2O_3$, and ZnO. In any case, usually, the ratio of metal atoms and oxygen atoms can be roughly expressed as $N_I+N_G+N_Z$:$1.5N_I+1.5N_G+N_Z$ (where $N_I$, $N_G$, $N_Z$ represent the number of atoms of In, Ga, and Zn, respectively).

Figure 2:
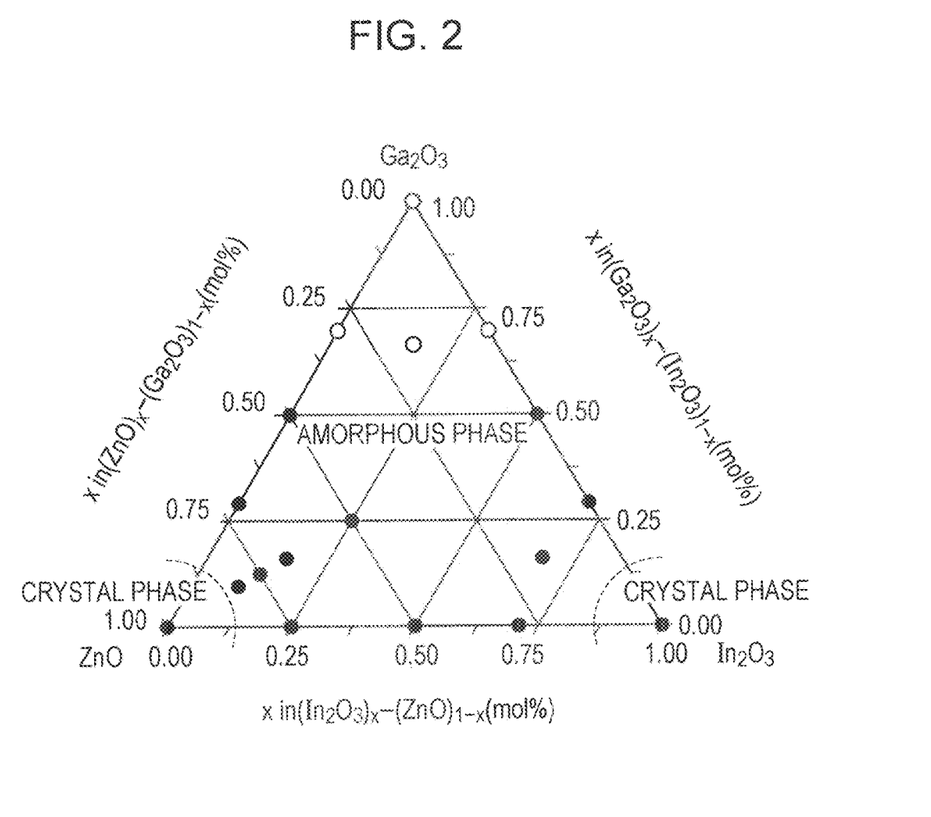
FIG. 2 is a diagram showing the composition of IGZO having an amorphous phase in Example 1.

Regarding the metals (In, Ga, and Zn), the ratios between the metals are not particularly limited as long as the oxide (IGZO) containing these metals has an amorphous phase and exhibits semiconducting properties. IGZO itself is publicly known, and the ratios between the metals (more particularly, molar ratios between InO, GaO, and ZnO) that allow formation of the amorphous phase are, for example, described in the above-mentioned Non-Patent Literature 1, the contents of which are hereby incorporated by reference. In this description, the diagram therein is shown as FIG. 2. When the percentages of ZnO and $In_2O_3$ are largely out of the range of the amorphous phase shown in FIG. 2 and extremely high to form a crystal phase, there is a possibility that problems may occur, such as difficulty in processing by wet etching, and loss of transistor characteristics.

As a typical composition, for example, a ratio of In:Ga:Zn (at %) of 2:2:1 or 1:1:1 may be used.

Furthermore, regarding the metals (In, Ga, and Zn), preferably, the ratio of each metal to the metals (In+Ga+Zn) constituting the oxide (IGZO-X) of the present invention is appropriately controlled such that desired TFT characteristics and the like can be obtained. Specifically, regarding Zn, the ratio of Zn to the metals is preferably 70 at % or less. When the ratio of Zn exceeds 70 at %, the oxide semiconductor film is crystallized, and a grain-boundary trapping level occurs, which may result in degradation of transistor characteristics, such as a decrease in carrier mobility, and an increase in the SS value. The ratio of Zn is more preferably 40 at % or less, and still more preferably 30 at % or less. Regarding the lower limit of Zn, in view of forming the amorphous structure and the like, the ratio of Zn to the metals is preferably 10 at % or more. The ratio of Zn is more preferably 15 at % or more, and still more preferably 20 at % or more. In addition, the upper limits and lower limits of the ratio of Zn may be arbitrarily combined to set a range.

The metals (In and Ga) other than Zn may be appropriately controlled such that Zn is controlled within the range described above and the ratios between the metals satisfy the ranges described above. Specifically, the ratio of In to the metals (In+Ga+Zn) is preferably 10 at % to 70 at %, and more preferably 25 at % or more. Furthermore, the ratio of Ga to the metals (In+Ga+Zn) is preferably 25 at % to 70 at %.

In the oxide of the present invention, a group X element is incorporated into IGZO. By adding at least one group X element selected from the group (group X) consisting of Al, Si, Ni, Ge, Sn, Hf, Ta, and W, stress resistance to voltage, light, and the like is improved. Furthermore, addition of the group X element does not greatly decrease the drain current value or does not adversely affect the carrier density (refer to Examples which will be described later). Furthermore, it has been experimentally confirmed that addition of the group X element does not cause problems, such as etching failure during wet etching. The group X elements may be added alone or in combination of two or more. Preferable group X elements are Si, Ni, Hf, and Ge, and more preferable group X elements are Si and Ni.

In the oxides containing the group X elements, usually, the group X elements are uniformly dispersed in the IGZO film and exist mainly as oxides.

Although the detailed mechanism of improvement in characteristics due to addition of the group X element is not known, it is assumed that the group X element has an effect of inhibiting oxygen deficiency which results in excess electrons in the oxide semiconductor. It is believed that since the amount of oxygen deficiency is decreased by addition of the group X element and the oxide has a stable structure, stress resistance to stress, such as voltage or light, is improved.

The preferable ratio of the group x element contained in all the metals (In, Ga, Zn, and the group X element) constituting the oxide (IGZO-X) of the present invention [X/(In+Ga+Zn+X)] is determined in consideration of the carrier density, stability of the semiconductor, and the like, and slightly differs depending on the type of the group X element. When each of Al, Ge, Hf, Ta, and W is used as the group X element, the ratio (percentage) is preferably 0.1 to 10 at %, and more preferably 2.0 to 6.0 at %. In addition, the upper limits and lower limits of the ratio of each of the elements described above may be arbitrarily combined to set a range. Furthermore, when each of Si and Sn is used as the group X element, the ratio is preferably 0.1 at % or more, more preferably 1 at % or more, and still more preferably 2.0 at % or more, and the ratio is preferably 15 at % or less, more preferably 8.0 at % or less, and still more preferably 4.0 at % or less. In addition, the upper limits and lower limits of the ratio of each of the elements described above may be arbitrarily combined to set a range. Furthermore, when Ni is used as the group X element, the ratio is preferably 0.1 to 5 at %, and more preferably 0.1 to 1.5 at %. When the composition ratio of the group X element is too low, there is a possibility that the effect of inhibiting oxygen deficiency may not be obtained sufficiently. On the other hand, when the composition ratio of the group X element is too high, since the carrier density in the semiconductor is decreased, there is a possibility that the on-state current may be decreased.

A description has been made above on the oxide of the present invention.

The oxide is preferably deposited by a sputtering method using a sputtering target (hereinafter, may be referred to as a "target"). Although the oxide may be formed by a chemical deposition method, such as a coating method, by using the sputtering method, it is possible to easily form a thin film having excellent in-plane uniformity in composition and thickness.

As the target used in the sputtering method, a sputtering target containing the elements described above and having the same composition as the desired oxide is preferably used. Thereby, it is possible to prevent a difference in composition and to form a thin film having the desired composition. Specifically, as the target, it is possible to use an oxide target containing at least one element selected from the group consisting of In, Ga, and Zn and at least one element selected from the group X consisting of Al, Si, Ni, Ge, Sn, Hf, Ta, and W. Furthermore, according a preferred embodiment, when the sputtering target contains Al as the element of the group X, preferably, Al/(In+Ga+Zn+Al)×100=0.1 to 10 at %; when the sputtering target contains Si as the element of the group X, preferably, Si/(In+Ga+Zn+Si)×100=0.1 to 15 at %; when the sputtering target contains Ni as the element of the group X, preferably, Ni/(In+Ga+Zn+Ni)×100=0.1 to 5 at %; when the sputtering target contains Ge as the element of the group X, preferably, Ge/(In+Ga+Zn+Ge)×100=0.1 to 10 at %; when the sputtering target contains Sn as the element of the group X, preferably, Sn/(In+Ga+Zn+Sn)×100=0.1 to 15 at %; when the sputtering target contains Hf as the element of the group X, preferably, Hf/(In+Ga+Zn+Hf)×100=0.1 to 10 at %; when the sputtering target contains Ta as the element of the group X, preferably, Ta/(In+Ga+Zn+Ta)×100=0.1 to 10 at %; and when the sputtering target contains W as the element of the group X, preferably, W/(In+Ga+Zn+W)×100=0.1 to 10 at %.

Alternatively, deposition may be performed using a co-sputter method in which two targets having different compositions are simultaneously discharged. By this method, it is possible to deposit an oxide semiconductor film having different X element contents in the same substrate plane. For example, as will be shown in Examples later, a target containing In, Ga, and Zn at a predetermined atomic ratio (e.g., 2:2:1 in terms of at %) and another target which includes a target having the composition described above and a pure metal chip made of a group X element fixed thereon are prepared, and by conducting a co-sputter method, an oxide of IGZO-X can be deposited.

The target may be produced, for example, by a powder sintering method.

When sputtering is performed using the target, preferably, the substrate temperature is set at room temperature, and the amount of oxygen to be added is appropriately controlled. The amount of oxygen to be added may be appropriately controlled depending on the structure of the sputtering system, the target composition, or the like. It is preferable to add oxygen such that the carrier concentration in the oxide semiconductor is about $10^{15}$ to $10^{16}$ cm$^{-3}$. In Examples, the amount of oxygen to be added was set so as to satisfy the expression $O_2/(Ar+O_2)=2\%$ (in terms of flow rate ratio).

Furthermore, when the oxide is used for a semiconductor layer of a TFT, the density of the oxide semiconductor layer is preferably 5.8 g/cm$^3$ or more (which will be described later). In order to deposit such an oxide, it is preferable to appropriately control the gas pressure during deposition by sputtering, the input power to the sputtering target, the substrate temperature, and the like. For example, it is believed that when the gas pressure during deposition is decreased, scattering of sputtered atoms does not occur and a compact (high-density) film can be deposited. Therefore, the total gas pressure during deposition may be set at a value at which the discharge of sputtering is stabilized, and is set preferably in a range of about 0.5 to 5 mTorr, and more preferably in a range of 1 to 3 mTorr. Furthermore, the input power is preferably as high as possible, and it is recommended that the input power be set at 2.0 W/cm$^2$ or more using DC or RF. The substrate temperature during deposition is preferably as high as possible, and it is recommended that the substrate temperature be controlled within a range of about room temperature to 200° C.

The thickness of the oxide film deposited as described above is preferably 30 to 200 nm, and more preferably 30 to 80 nm.

The present invention also covers a TFT including the oxide described above for a semiconductor layer of the TFT. The TFT includes at least a gate electrode, a gate-insulating film, a semiconductor layer composed of the oxide, a source electrode, and a drain electrode disposed on a substrate, and the structure thereof is not particularly limited as long as it is a commonly used structure.

In this case, preferably, the oxide semiconductor layer has a density of 5.8 g/cm$^3$ or more. As the density of the oxide semiconductor layer increases, the number of defects in the film decreases, resulting in improvement of the film quality, and the interatomic distance decreases. Consequently, the field-effect mobility of the TFT element is largely increased, electrical conductivity is increased, and stability with respect to stress to light irradiation is improved. The density of the oxide semiconductor layer is preferably as high as possible, more preferably 5.9 g/cm$^3$ or more, and still more preferably 6.0 g/cm$^3$ or more. Note that the density of the oxide semiconductor layer is measured by the method stated in Examples described later.

Figure 1:
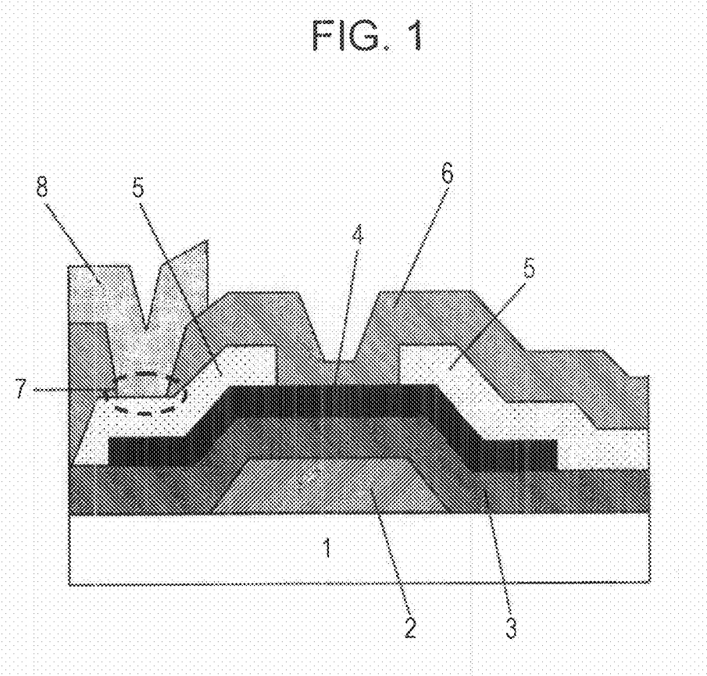
FIG. 1 is a schematic cross-sectional view illustrating a thin film transistor including an oxide semiconductor in Example 1.

A method of fabricating the TFT according to an embodiment will be described below with reference to FIG. 1. The TFT shown in FIG. 1 and the fabrication method described below are examples of the preferred embodiment of the present invention. It is to be understood that the present invention is not limited thereto. For example, although FIG. 1 shows a TFT having a bottom-gate structure, the TFT is not limited thereto. The TFT may have a top-gate structure in which a gate-insulating film and a gate electrode are disposed in that order on an oxide semiconductor layer.

As shown in FIG. 1, a gate electrode 2 and a gate-insulating film 3 are disposed on a substrate 1, and an oxide semiconductor layer 4 is disposed thereon. Source/drain electrodes 5 are disposed on the oxide semiconductor layer 4, and a protective film (insulating film) 6 is disposed thereon. A transparent conductive film 8 is electrically connected to the drain electrode 5 through a contact hole 7.

The method for forming the gate electrode 2 and the gate-insulating film 3 on the substrate 1 is not particularly limited, and a commonly used method may be employed. Furthermore, the types of the gate electrode and the gate-insulating film 3 are not particularly limited, and types that are widely used can be used. For example, as the gate electrode, a metal having low electrical resistivity, such as Al or Cu, or an alloy thereof may be preferably used. Furthermore, typical examples of the gate-insulating film include a silicon oxide film, a silicon nitride film, and a silicon oxynitride film. In addition, oxides, such as $Al_2O_3$ and $Y_2O_3$ and a laminate of these can also be used.

Next, the oxide semiconductor layer 4 is formed. As described above, the oxide semiconductor layer 4 is preferably deposited by a DC sputtering method or an RF sputtering method using a sputtering target having the same composition as that of the thin film. Alternatively, the oxide semiconductor layer 4 may be deposited by a co-sputter method.

The oxide semiconductor layer 4 is subjected to wet etching, and then patterning is performed. Preferably, heat treatment (pre-annealing) is performed immediately after patterning in order to improve the film quality of the oxide semiconductor layer 4. Thereby, transistor characteristics, such as the on-state current and field-effect mobility, are improved, and transistor performance is improved.

After the pre-annealing is performed, the source/drain electrodes 5 are formed. The type of the source/drain electrodes is not particularly limited, and a type that is widely used can be used. For example, as in the gate electrode, a metal, such as Al or Cu, or an alloy thereof may be used, and as in Examples which will be described later, pure Ti may be used.

In order to form the source/drain electrodes 5, for example, a method may be used in which a metal thin film is deposited by a magnetron sputtering method, and then a lift-off process is performed. There is a method in which, instead of forming the electrodes by a lift-off process as described above, a predetermined metal thin film is formed by a sputtering method in advance, and then the electrodes are formed by patterning. However, in this method, the oxide semiconductor layer is damaged when the electrodes are formed by etching, and therefore, transistor characteristics are degraded. In order to avoid such a problem, a method is employed in which a protective film is formed on the oxide semiconductor layer in advance, and then the electrodes are formed, followed by patterning. This method was employed in Examples described later.

Next, the protective film (insulating film) 6 is deposited by a CVD (chemical vapor deposition) method on the oxide semiconductor layer 4. Conductivity is easily imparted to the surface of the oxide semiconductor film because of plasma damage due to CVD (the reason for this is assumed to be that oxygen deficiency produced on the surface of the oxide semiconductor serves as electron donors). In order to avoid the problem described above, in Examples described later, $N_2O$ plasma irradiation was performed before the deposition of the protective film. As $N_2O$ plasma irradiation conditions, the conditions described in the literature below were employed. Note that the contents of the literature below are hereby incorporated by reference.

J. Park et al., Appl. Phys. Lett., 1993, 053505(2008)

Next, in accordance with the usual method, the transparent conductive film 8 is electrically connected to the drain electrode 5 through the contact hole 7. The types of the transparent conductive film and the drain electrode are not particularly limited, and types that are commonly used can be used. As the drain electrode, for example, the examples that are shown for the source/drain electrodes can be used.

EXAMPLES

The present invention will be described more specifically on the basis of Examples. However, the present invention is not limited to Examples below, and various modifications can be made without departing from the spirit of the present invention described above and below. Each of the modifications is intended to be embraced in the technical scope of the present invention.

Example 1

Thin film transistors (TFTs) shown in FIG. 1 were fabricated on the basis of the method described above, and TFT characteristics and stress resistance were evaluated.

First, on a glass substrate (Eagle 2000 manufactured by Corning Inc., 100 mm in diameter×0.7 mm in thickness), a Ti thin film as a gate electrode with a thickness of 100 nm and a gate-insulating film of $SiO_2$ (200 nm) were deposited in that order. The gate electrode was deposited, using a sputtering target made of pure Ti, by a DC sputtering method at deposition temperature of room temperature, at a deposition power of 300 W, using Ar as a carrier gas, and at a gas pressure of 2 mTorr. Furthermore, the gate-insulating film was deposited by a plasma CVD method, using a mixed gas of $SiH_4$ and $N_2O$ as a carrier gas, at a deposition power of 100 W, and at a deposition temperature of 300° C.

Next, oxide thin films having various compositions shown in Table 1 were deposited by a sputtering method, using sputtering targets (which will be described later). As the oxide thin films, in addition to those composed of IGZO-X (examples of the present invention) including the group X element incorporated into IGZO, for comparison, a film composed of IGZO (conventional example) and films including Cu, La, or Mo, as an element other than the group X element, incorporated into IGZO were also deposited. The system used for sputtering was a "CS-200" manufactured by ULVAC, Inc., and the sputtering conditions are as follows:

Substrate temperature: room temperature
Gas pressure: 5 mTorr
Oxygen partial pressure: $O_2/(Ar+O_2)=2\%$
Thickness: 50 to 150 nm
Size of target used: φ4 inch×5 mm When IGZO (conventional example) was deposited, an RF sputtering method was employed, using a sputtering garget having a In:Ga:Zn ratio (at %) of 2:2:1. Furthermore, when an oxide thin film containing another element incorporated into IGZO was deposited, a co-sputter method was employed in which two targets having different compositions were simultaneously discharged. More particularly, as the sputtering targets, a sputtering target having an In:Ga:Zn ratio (at %) of 2:2:1 and a target including the sputtering target described above on which a pure metal chip of the group X element, Cu, La, or Mo was fixed were used.

The contents of metal elements in the oxide thin films thus obtained were analyzed by an XPS (X-ray photoelectron spectroscopy) method.

After the oxide thin film was deposited as described above, patterning was performed by photolithography and wet etching. As a wet etchant solution, a "ITO-07N" manufactured by Kanto Chemical was used. In this example, regarding the oxide thin films experimented, wet etchability was evaluated by observation with an optical microscope. The evaluation results confirm that no etching residue was found in all of the compositions experimented, and etching was performed adequately.

After the oxide semiconductor film was patterned, pre-annealing treatment was performed in order to improve the film quality. The pre-annealing was performed in a 100% oxygen atmosphere, under atmospheric pressure, at 350° C. for one hour.

Next, using pure Ti, source/drain electrodes were formed by a lift-off process. Specifically, after patterning was performed using a photoresist, a Ti thin film was deposited (thickness: 100 nm) by a DC sputtering method. The method of depositing the Ti thin film for source/drain electrodes are the same as that for the gate electrode described above. Next, an unnecessary photoresist was removed with an ultrasonic cleaner in acetone. In the TFT, the channel length was set at 10 μm and the channel width was set at 200 μm.

After the source/drain electrodes were formed in such a manner, a protective film for protecting the oxide semiconductor layer was formed. As the protective film, a laminated film (total thickness: 400 nm) including $SiO_2$ (thickness: 200 nm) and SiN (thickness: 200 nm) was used. The $SiO_2$ and SiN were formed, using a "PD-220NL" manufactured by Samco Inc., by a plasma CVD method. In this example, after plasma treatment was carried out using $N_2O$ gas, the $SiO_2$ film and the SiN film were formed in that order. A mixed gas of $N_2O$ and $SiH_4$ was used for formation of the $SiO_2$ film, and a mixed gas of $SiH_4$, $N_2$, and $NH_3$ was used for formation of the SiN film. In each case, the deposition power was set at 100 W, and the deposition temperature was set at 150° C.

Next, a contact hole for probing for evaluation of transistor characteristics was formed in the protective film by photolithography and dry etching. Next, an ITO film (thickness: 80 nm) was deposited, using a DC sputtering method, with a mixed gas of argon and oxygen as a carrier gas, at a deposition power of 200 W, and at a gas pressure of 5 mTorr. Thereby, a TFT shown in FIG. 1 was fabricated. The deposition power was set at 200 W, the gas pressure was set at 5 mTorr, and argon gas and oxygen gas were used.

Regarding each of the TFTs thus obtained, (1) transistor characteristics (drain current-gate voltage characteristics, Id–Vg characteristics), and (2) changes in the threshold voltage, SS value, and carrier mobility before and after application of stress were examined as described below.

(1) Measurement of Transistor Characteristics

Transistor characteristics were measured using a semiconductor parameter analyzer "4156C" manufactured by Agilent Technology Corp. Detailed measurement conditions are as follows:

Source voltage: 0 V
Drain voltage: 10 V
Gate voltage: −30 to 30 V (measurement interval: 1 V)

(2) Evaluation of Stress Resistance (Stress: Light Irradiation and Application of Negative Bias)

In this example, a stress application test was conducted in which, simulating an environment (stress) during actual panel operation, the gate electrode was irradiated with light while being applied with a negative bias. Conditions for application of stress were as follows. As the wavelength of light, about 400 nm that was close to the bandgap of the oxide semiconductor and at which transistor characteristics were likely to change was selected.

Gate voltage: −20 V
Substrate temperature: 60° C.
Light stress
Wavelength: 400 nm
Illuminance (intensity of light with which TFT is irradiated): 0.1 μW/cm$^2$
Light source: LED manufactured by OPTOSUPPLY Limited (amount of light is adjusted by ND filter)
Stress application time: 3 hours The term "threshold voltage" roughly refers to the gate voltage value when the transistor changes from an off-state (a state in which the drain current is low) to an on-state (a state in which the drain current is high). In this example, a voltage at which the drain current is about 1 nA, which lies between the on-state current and the off-state current, is defined as the threshold voltage. The amount of change (amount of shift) in the threshold voltage before and after application of stress was measured.

Furthermore, the minimum value of the gate voltage required for increasing the drain current by one order of magnitude was defined as the SS value. Furthermore, the carrier mobility (field-effect mobility) was calculated from the slope of Id∝(Vg−Vth) in a region (linear region) in which the relationship Id∝(Vg−Vth) (Vth=threshold voltage) was satisfied.

The results thereof are shown in Table 1. In Table 1, the amount of shift in the threshold voltage before and after application of stress, and the carrier mobility and SS value before and after application of stress are described. Note that, in Table 1, for example, InGaZnO-0.1 at % Si (No. 5) means that the atomic percentage of Si in all the metals (In+Ga+Zn+Si) constituting the oxide semiconductor is 0.1 at %.

Furthermore, regarding some examples, the results of drain current-gate voltage characteristics (Id–Vg characteristics) before and after application of stress are shown in FIGS. 3 to 12. In FIGS. 3 to 9, the results before application of stress are indicated by broken lines, and the results after application of stress are indicated by solid lines.

First, consideration will be given to the results of the conventional example in which IGZO was used.

Figure 3:
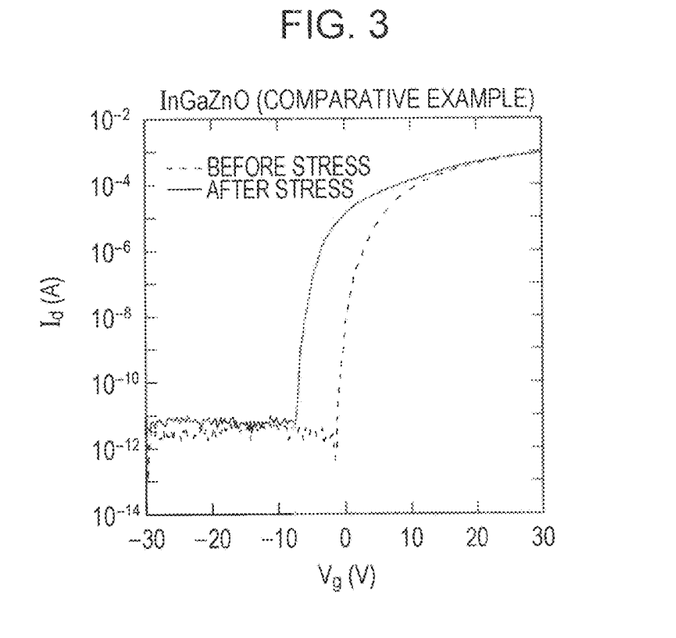
FIG. 3 is a graph showing TFT characteristics before and after application of stress when composition No. 1 (IGZO) is used in Example 1.
Figure 4:
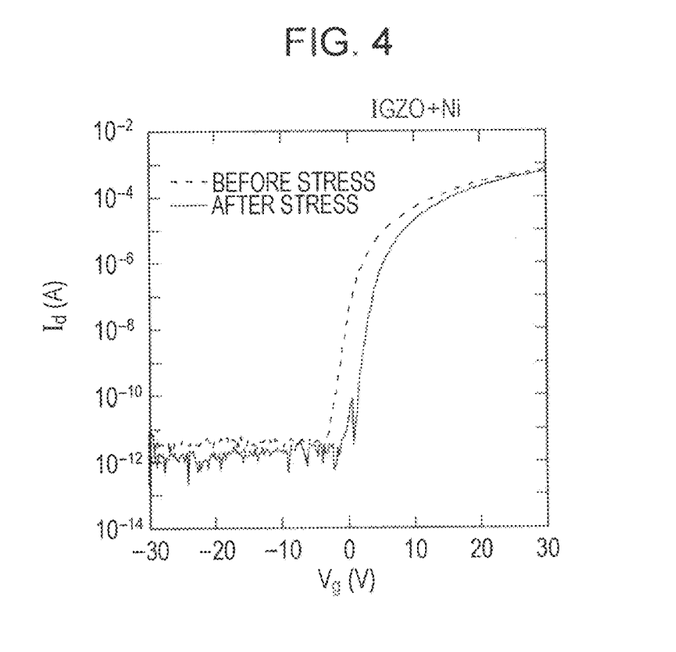
FIG. 4 is a graph showing TFT characteristics before and after application of stress when composition No. 10 (IGZO-Ni) is used in Example 1.
Figure 5:
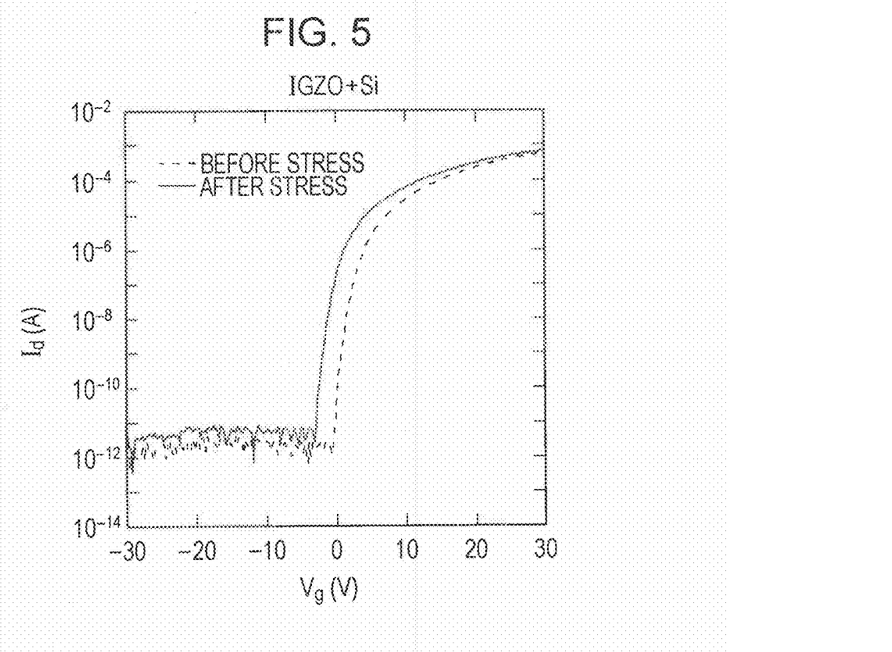
FIG. 5 is a graph showing TFT characteristics before and after application of stress when composition No. 6 (IGZO-Si) is used in Example 1.
Figure 6:
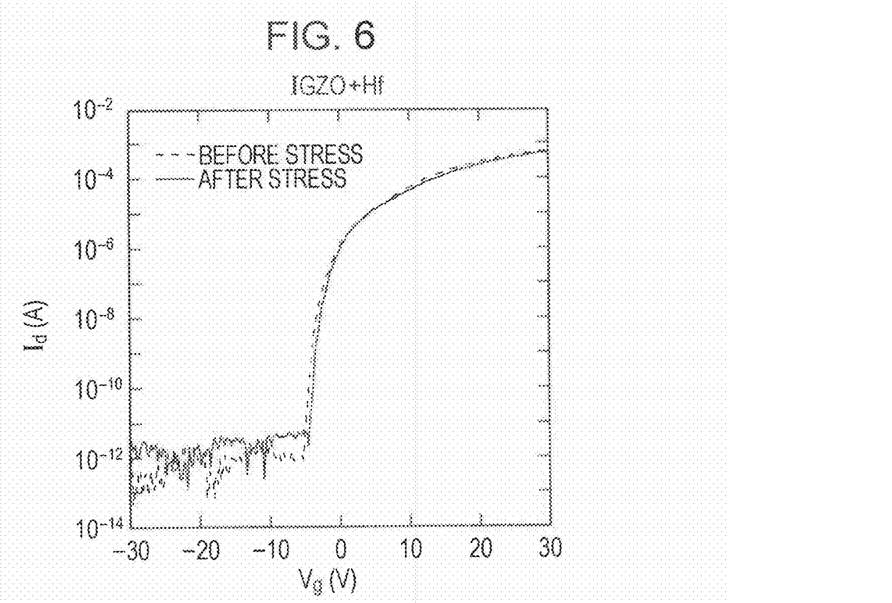
FIG. 6 is a graph showing TFT characteristics before and after application of stress when composition No. 12 (IGZO-Hf) is used in Example 1.
Figure 7:
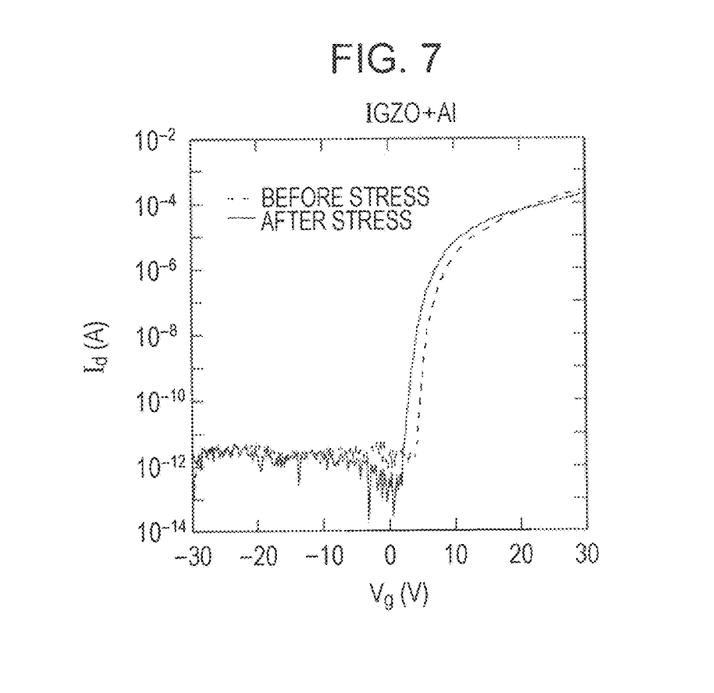
FIG. 7 is a graph showing TFT characteristics before and after application of stress when composition No. 17 (IGZO-Al) is used in Example 1.
Figure 8:
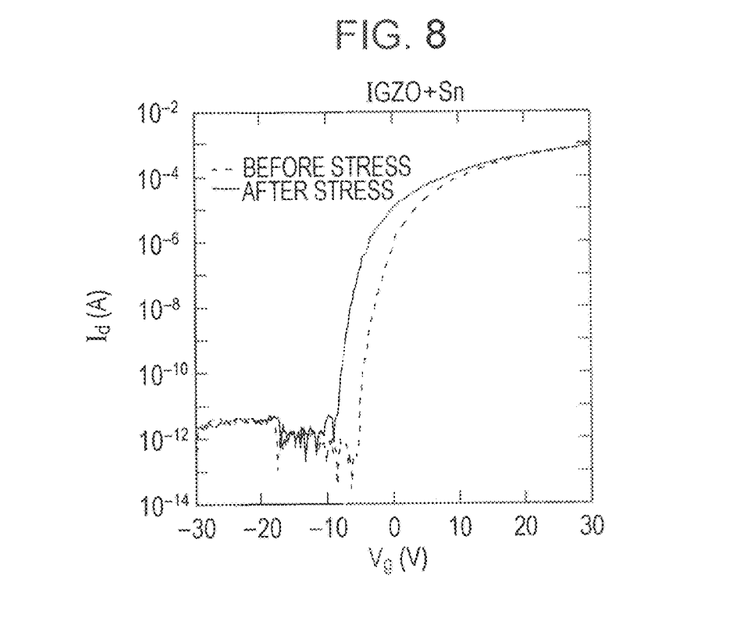
FIG. 8 is a graph showing TFT characteristics before and after application of stress when composition No. 15 (IGZO-Sn) is used in Example 1.
Figure 9:
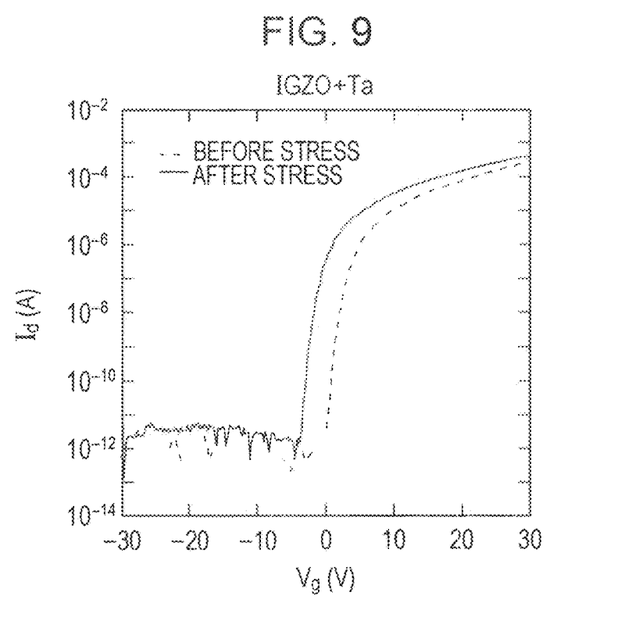
FIG. 9 is a graph showing TFT characteristics before and after application of stress when composition No. 22 (IGZO-Ta) is used in Example 1.

FIG. 3 shows the results of TFT characteristics when the composition No. 1 (InGaZnO) was used. As shown in FIG. 3, before application of stress (in the broken line in FIG. 3), the drain current Id starts to increase at a gate voltage Vg of about −3 V, and a switching operation is observed. The Ion/Ioff ratio is 8 orders of magnitude or more, where the off-state current Ioff(A) is Id when Vg=−30 V, and the on-state current Ion(A) is Id when Vg=30 V. Furthermore, the SS value before application of stress is 0.4 V/decade, and the carrier mobility is 12.5 cm$^2$/Vs (refer to Table 1).

In contrast, after application of stress, the SS value is 0.4 V/decade and the carrier mobility is 12.7 cm$^2$/Vs (refer to Table 1); and although these values are not substantially changed before and after application of stress, as shown in FIG. 3, the threshold voltage is largely changed. The amount of shift in the threshold voltage from 0 hour (without stress) to 3 hours (application of stress) is −6.2 V (refer to Table 1).

In this example, the result of No. 1 described above is considered as a standard. When each result is equal to or less than the standard, the result is evaluated as passing.

In Table 1, Nos. 5 to 7 (group X element=Si), Nos. 8 to 10 (group X element=Ni), Nos. 11 to 13 (group X element=Hf), Nos. 14 to 16 (group X element=Sn), Nos. 17 to 18 (group X element=Al), Nos. 19 to 20 (group X element=Ge), Nos. 21 to 22 (group X element=Ta), and Nos. 23 to 24 (group X element=W) are examples in which the oxide semiconductor containing the group X element specified in the present invention within the predetermined range is used. In all of these examples, the absolute value of the amount of shift in the threshold voltage is smaller than that of No. 1, and the carrier mobility and the SS value before and after application of stress are equal to or smaller than those of No. 1. Among them, the results of TFT characteristics of No. 10 (group X element=Ni), No. 6 (group X element=Si), No. 12 (group X element=Hf), No. 17 (group X element=Al), No. 15 (group X element=Sn), and No. 22 (group X element=Ta) are shown in FIGS. 4 to 9.

TABLE 1

| No | Composition | Amount of shift in threshold voltage (V) | Mobility before stress (cm$^2$/Vs) | Mobility after stress (cm$^2$/Vs) | SS value before stress (V/decade) | SS value after stress (V/decade) | Evaluation |
|---|---|---|---|---|---|---|---|
| 1 | InGaZnO | −6.2 | 12.5 | 12.7 | 0.4 | 0.4 | o |
| 2 | InGaZnO—5 at % Cu | — | — | — | — | — | x |
| 3 | InGaZnO—5 at % La | — | 0.1 | — | 2.0 | — | x |
| 4 | InGaZnO—5 at % Mo | — | 0.4 | — | 1.4 | — | |
| 5 | InGaZnO—0.1 at % Si | −1.8 | 9.8 | 9.5 | 0.5 | 0.4 | o |
| 6 | InGaZnO—5 at % Si | −2.7 | 11.4 | 11.7 | 0.4 | 0.5 | o |
| 7 | InGaZnO—15 at % Si | −5.1 | 10.8 | 10..2 | 0.4 | 0.4 | o |
| 8 | InGaZnO—0.1 at % Ni | −2.1 | 8.8 | 7.9 | 0.5 | 0.4 | o |
| 9 | InGaZnO—2 at % Ni | −0.7 | 8.9 | 9.2 | 0.5 | 0.5 | o |
| 10 | InGaZnO—5 at % Ni | 3.3 | 11.9 | 12.0 | 0.5 | 0.4 | o |
| 11 | InGaZnO—0.1 at % Hf | −3.5 | 5.3 | 7.6 | 0.4 | 0.5 | o |
| 12 | InGaZnO—5 at % Hf | 0.6 | 10.9 | 10.8 | 0.5 | 0.5 | o |
| 13 | InGaZnO—10 at % Hf | −4 | 10.7 | 10.1 | 0.5 | 0.4 | o |
| 14 | InGaZnO—0.1 at % Sn | −5.2 | 6.3 | 6.4 | 0.3 | 0.4 | o |
| 15 | InGaZnO—5 at % Sn | −3.3 | 11.2 | 11.1 | 0.4 | 0.4 | o |
| 16 | InGaZnO—15 at % Sn | −3.7 | 13.9 | 13.6 | 0.4 | 0.5 | o |
| 17 | InGaZnO—0.1 at % Al | −2.1 | 7.5 | 6.5 | 0.4 | 0.5 | o |
| 18 | InGaZnO—10 at % Al | −4.7 | 6.1 | 6.2 | 0.4 | 0.4 | o |
| 19 | InGaZnO—0.1 at % Ge | −2.2 | 5.2 | 5.7 | 0.6 | 0.5 | o |
| 20 | InGaZnO—10 at % Ge | 0.6 | 5.5 | 5.1 | 0.5 | 0.5 | o |
| 21 | InGaZnO—0.1 at % Ta | −5.5 | 4.5 | 6.2 | 0.4 | 0.4 | o |
| 22 | InGaZnO—10 at % Ta | −4.3 | 7.8 | 8.6 | 0.4 | 0.4 | o |
| 23 | InGaZnO—0.1 at % W | −5.7 | 11.9 | 9.4 | 0.5 | 0.4 | o |
| 24 | InGaZnO—10 at % W | −5.3 | 3.7 | 4.4 | 0.5 | 0.5 | o |

Figure 10:
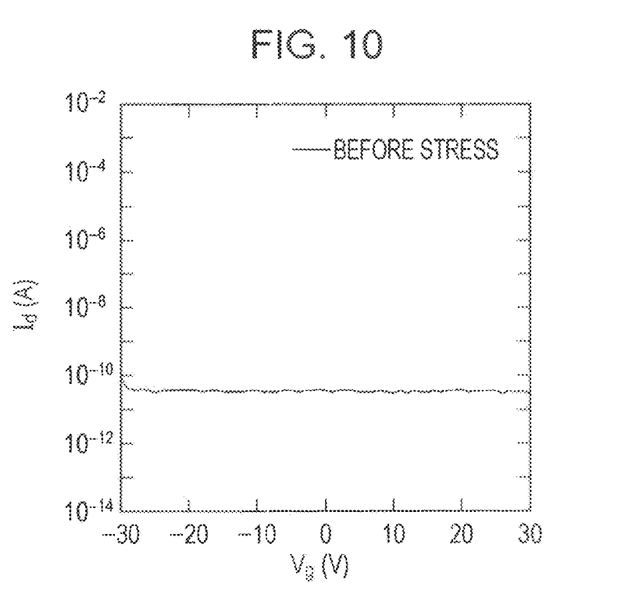
FIG. 10 is a graph showing TFT characteristics before application of stress when composition No. 2 (IGZO-Cu) is used in Example 1.
Figure 11:
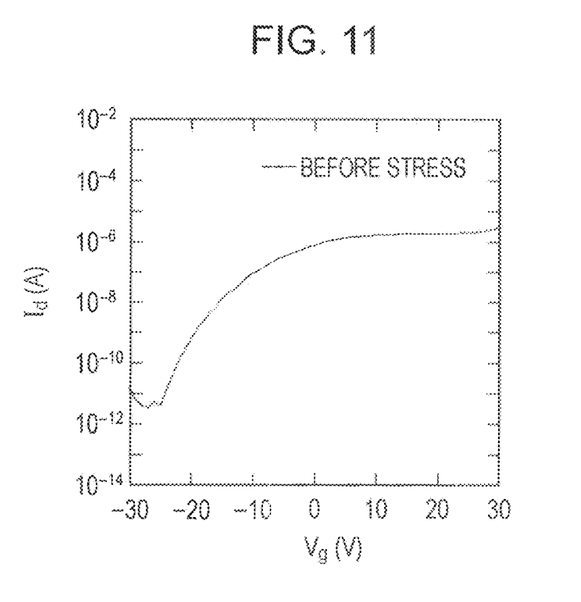
FIG. 11 is a graph showing TFT characteristics before application of stress when composition No. 3 (IGZO-La) is used in Example 1.
Figure 12:
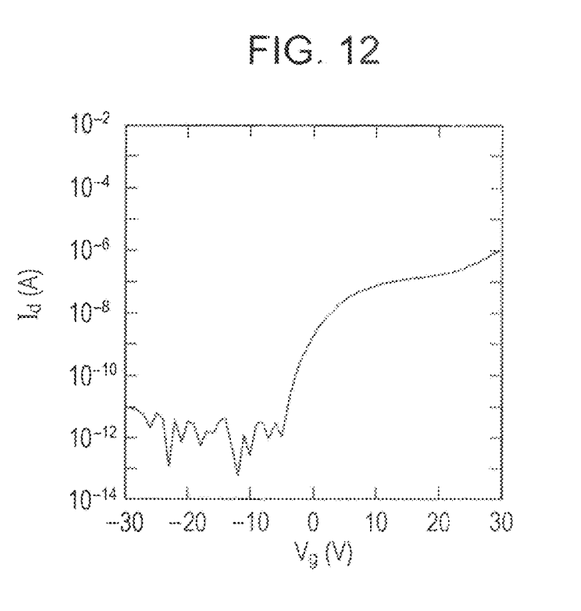
FIG. 12 is a graph showing TFT characteristics before application of stress when composition No. 4 (IGZO-Mo) is used in Example 1.

On the other hand, Nos. 2 to 4 in Table 1 and FIGS. 10 to 12 show the results when an element (Cu, La, or Mo) other than the group X element specified in the present invention is added. No. 4 is an example in which the above-mentioned Patent Literature 1 is simulated. When these elements are added, the drain current value before application of stress is low (refer to FIGS. 10 to 12). The reason for this is believed to be that the carrier density in the semiconductor is decreased by addition of the element. Since the TFT characteristics before application of stress were degraded, stress application was not performed.

The experimental results confirm that by using an oxide semiconductor containing a predetermined amount of the group X element specified in the present invention, it is possible to obtain TFT characteristics that are comparable to those in the case where conventional IGZO is used. Furthermore, since wet etching was performed satisfactorily, it is assumed that the oxide incorporated with the group X element 1 has an amorphous structure.

Example 2

Thin film transistors (TFTs) shown in FIG. 1 were fabricated as in Example 1 except that oxide thin films had the compositions shown in Table 2.

Regarding each of the TFTs, (1) transistor characteristics and (2) the threshold voltage and SS value in the presence or absence of stress caused by light irradiation were examined as described below.

(1) Measurement of Transistor Characteristics

Transistor characteristics were measured using a semiconductor parameter analyzer "4156C" manufactured by Agilent Technology Corp. Detailed measurement conditions are as follows:

Source voltage: 0 V
Drain voltage: 10 V
Gate voltage: −30→30 V→−30 V (measurement interval: 0.25 V)
Measurement temperature: 60° C.

(2) Evaluation of Light Irradiation Stress Resistance (as Stress, Light Irradiation+Change in Voltage)

In this example, TFT characteristics, the threshold voltage, and the SS value (V/dec) were examined, simulating an environment during operation of a panel of a display device, such as a liquid crystal or organic EL display, while changing the gate voltage, in the case where light irradiation was not performed (dark state: in the absence of application of stress) and in the case where light irradiation was performed (light state: in the presence of application of stress). Conditions for application of stress were as follows. As the wavelength of light, about 400 nm that was close to the bandgap of the oxide semiconductor and at which transistor characteristics were likely to change was selected. Specifically, a measurement method was used in which, while the gate voltage was changed as described below, the presence or absence of hysteresis of Id–Vg characteristics were examined in the case where light irradiation was not performed (dark state) and the case where light irradiation was performed (light state).

Gate voltage: −30→30 V→−30 V (measurement interval: 0.25 V)
Substrate temperature: 60° C.
Light irradiation stress
Wavelength: 400 nm
Illuminance (intensity of light with which TFT is irradiated): 6.5 µW/cm$^2$ Light source: Blue LED bulb manufactured by OPTO-SUPPLY Limited (intensity of light is adjusted by adjusting current to be applied to LED bulb)

The measurement of the threshold voltage and the calculation of the SS value were performed as in Example 1.

Figure 13:
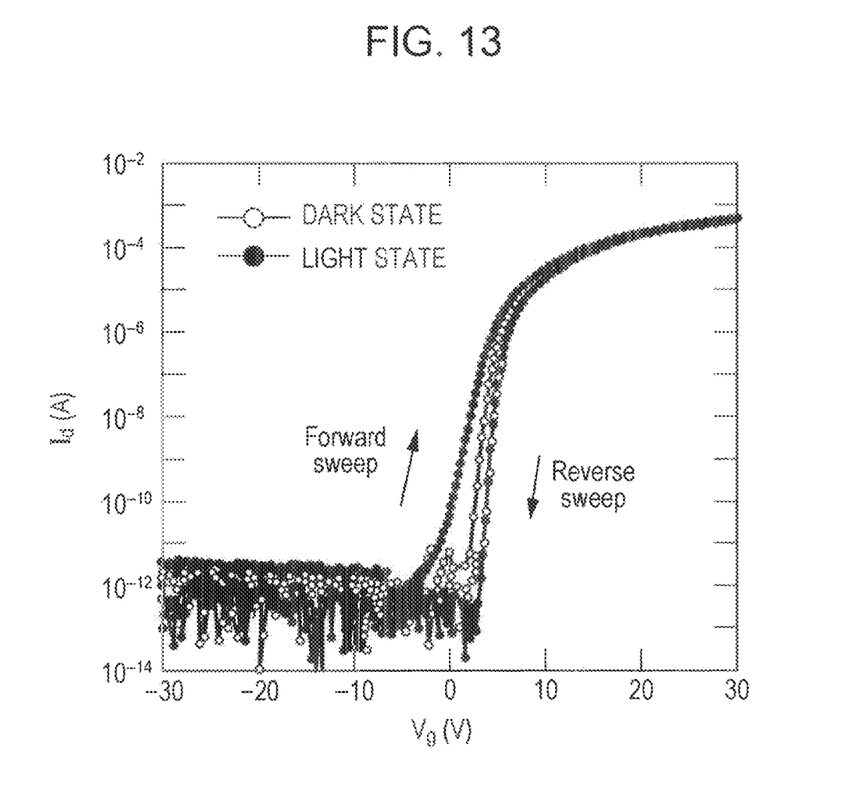
FIG. 13 is a graph showing TFT characteristics before and after application of stress when semiconductor composition No. 1 (IGZO) is used in Example 2.
Figure 14:
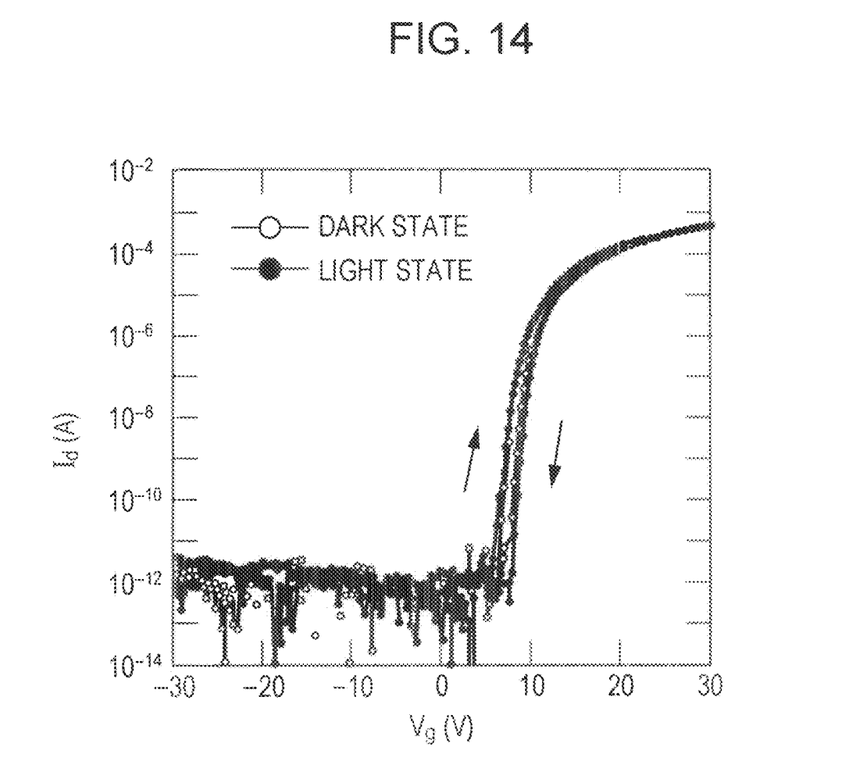
FIG. 14 is a graph showing TFT characteristics before and after application of stress when semiconductor composition No. 2 (IGZO-Si) is used in Example 2.

The results thereof are shown in Table 2. In Table 2, the amount of shift in the threshold voltage (ΔVth(V)) in Forward Sweep and Reverse Sweep, and the SS value (V/dec) in Forward Sweep are described. Furthermore, regarding some examples, the results of drain current-gate voltage characteristics (Id–Vg characteristics) before and after application of stress are shown in FIGS. 13 and 14. In FIGS. 13 and 14, the results of the dark state are indicated by the line with hollow circles (○), and the results of the light state are indicated by the line with solid circles (●). Furthermore, in the drawing, the left arrow (upward) indicates a process in which the voltage is increased from −30 V to 30 V (Forward Sweep), and the right arrow (downward) indicates a process in which the voltage is decreased from 30 V to −30 V (Reverse Sweep).

TABLE 2

| Semiconductor | Dark state | | Light state | |
|---|---|---|---|---|
| No composition | DV$_{th}$ (V) | SS (V/dec) | DV$_{th}$ (V) | SS (V/dec) |
| 1 InGaZnO | 1.0 | 0.40 | 3.8 | 0.95 |
| 2 IGZO—2.3 at. % Si | 1.3 | 0.42 | 1.3 | 0.43 |
| 3 IGZO—2.2 at. % Hf | 1.0 | 0.35 | 1.1 | 0.38 |
| 4 IGZO—0.5 at. % Ni | 1.1 | 0.40 | 1.1 | 0.41 |

First, consideration will be given to the results of the conventional example in which IGZO (No. 1) was used.

FIG. 13 shows the results of TFT characteristics when the composition No. 1 (InGaZnO) was used. As shown in FIG. 13, in the dark state (the line with hollow circles ○ in FIG. 13), the difference in characteristics between Forward Sweep and Reverse Sweep was small, and the amount of shift in the threshold voltage was 1.0 V. On the other hand, in the light state (the line with solid circles ● in FIG. 13), the difference in characteristics between Forward Sweep and Reverse Sweep was large, the rise of the Id–Vg characteristics was gentle, and the amount of shift in the threshold voltage to Reverse Sweep was 3.8 V. The reason for this is assumed to be that electrons and holes are excited by irradiation of blue light that is close to the bandgap of IGZO, and holes are trapped at the interface between the gate-insulating film and the semiconductor layer by the bias applied to the gate electrode.

In this example, the result of IGZO (No. 1) described above is considered as a standard. When each result is equal to or less than the standard, the result is evaluated as passing.

In Table 2, No. 2 (group X element=Si), No. 3 (group X element=Hf), and No. 4 (group X element=Ni) are examples in which the oxide semiconductor containing the group X element specified in the present invention within the predetermined range is used (in all of which, IGZO has an In:Ga:Zn ratio of 2:2:1. In all of these examples, the absolute value of the amount of shift in the threshold voltage is smaller than that of No. 1, and the SS value is smaller than that of No. 1. Among them, the results of TFT characteristics of No. 2 are shown in FIG. 14.

As shown in FIG. 14, in the dark state (the line with hollow circles ○ in FIG. 14), the difference in characteristics between Forward Sweep and Reverse Sweep was small, and the amount of shift in the threshold voltage was 1.3 V. On the other hand, in the light state (the line with solid circles ● in FIG. 14), the difference in characteristics between Forward Sweep and Reverse Sweep was also small, the rise of the Id–Vg characteristics was steep, and the amount of shift in the threshold voltage to Reverse Sweep was 1.3 V. This shows that, by adding Si (group X element) to IGZO, the change in TFT characteristics with respect to light irradiation is suppressed, and stress resistance to stress caused by light irradiation is improved.

Furthermore, as in No. 2, in Nos. 3 and 4 in which the amount of shift in the threshold voltage between Forward Sweep and Reverse Sweep and the SS value are not substantially changed, the effect of suppressing the change in TFT characteristics with respect to light irradiation is exhibited, and thus it is clear that the light irradiation stress resistance is improved.

The experimental results show that although the transistor substrate including the oxide semiconductor composed of InGaZnO is largely influenced by irradiation of blue light that is close to the bandgap of the oxide semiconductor (No. 1), by using the oxide semiconductor containing a predetermined amount of the group X element specified in the present invention (Nos. 2 to 4), it is possible to suppress influence by light irradiation.

In Example 2, although the experimental results on only some of the elements are shown, the present inventors have confirmed that regarding other group X elements, better results can be similarly obtained than those of No. 1.

Example 3

In this example, the density of oxide films (thickness: 100 nm) obtained by controlling the sputtering gas pressure during deposition to 1 or 5 mTorr, using an oxide (InGaZnO-5 at % Si, In:Ga:Zn=2:2:1) corresponding to No. 6 in Table 1, was measured, and with respect to TFTs fabricated in the same manner as that in Example 1, mobility and the amount of change in the threshold voltage after stress testing (light irradiation+application of a negative bias) were examined. The method of measuring the film density is as follows:

(Measurement of Density of Oxide Film)

The density of the oxide film was measured using XRR (X-ray reflectometry). Detailed measurement conditions are as follows:

Analyzer: Horizontal X-ray diffractometer SmartLab manufactured by Rigaku Corp.

Target: Cu (radiation source: Kα ray)

Target output: 45 kV-200 mA

Production of measurement sample

An oxide with the respective composition was deposited on a glass substrate under sputtering conditions described below (thickness: 100 nm), and then, simulating the pre-annealing treatment in the TFT fabrication process in Example 1, the same heat treatment as the pre-annealing treatment was performed.

Sputtering gas pressure: 1 or 5 mTorr

Oxygen partial pressure: $O_2/(Ar+O_2)=2\%$

Deposition power density: DC 2.55 W/cm$^2$

Heat treatment: In atmosphere, at 350° C., for one hour

The results thereof are shown in Table 3.

TABLE 3

| No. | Composition | Gas pressure during deposition (mTorr) | Density (g/cm$^3$) | Mobility (cm$^2$/Vs) | ΔVth (V) |
|---|---|---|---|---|---|
| 1 | InGaZnO—5 at % Si | 1 | 6.11 | 12.3 | −1.5 |
| 2 | (In:Ga:Zn = 2:2:1) | 5 | 5.92 | 11.4 | −2.7 |

As shown in table 3, each of the oxide containing Si, which is the group X element specified in the present invention, has a high density of 5.8 g/cm$^3$ or more. More particularly, while the density of the film (No. 2) in which gas pressure=5 mTorr is 5.92 g/cm$^3$, the density of the film (No. 1) in which gas pressure=1 mTorr is 6.11 g/cm$^3$, and thus a higher density is obtained. Furthermore, as the film density increases, the field-effect mobility is improved, and the absolute value of the amount of shift in the threshold voltage ΔVth in stress testing is decreased.

The experimental results show that the density of the oxide film is changed in response to the sputtering gas pressure during deposition; when the gas pressure is decreased, the film density is increased, resulting in a marked increase in the field-effect mobility; and the absolute value of the amount of shift in the threshold voltage ΔVth in stress testing (light irradiation+negative bias stress) is also decreased. The reason for this is assumed that, by decreasing the sputtering gas pressure during deposition, scattering of sputtered atoms (molecules) can be suppressed, the number of defects in the film is decreased, resulting in improvement in mobility and electrical conductivity, and thus stability of the TFT is improved.

Although the results of Si as the group X element are shown in Table 3, the relationship between the density of the oxide film, mobility in TFT characteristics, and the amount of change in the threshold voltage after stress testing has also been observed in the case where other group X elements are used.

The present application has been described in detail and with reference to specific embodiments. However, it is apparent to the person skilled in the art that various modifications and changes can be made to the invention without departing from the spirit and scope of the present invention.

This application claims the benefit of Japanese Patent Application No. 2010-088725 filed in the Japan Patent Office on Apr. 7, 2010, Japanese Patent Application No. 2010-255249 filed in the Japan Patent Office on Nov. 15, 2010, and Japan Patent Application No. 2011-008322 filed in the Japan Patent Office on Jan. 18, 2011, the entire contents of these applications being incorporated herein by reference.

INDUSTRIAL APPLICABILITY

The oxide of the present invention imparts good switching characteristics and stress resistance, and, in particular, a small change in the threshold voltage after application of stress, to a thin film transistor. Therefore, it is possible to provide a thin film transistor having excellent TFT characteristics and stress resistance. Consequently, by using the thin film transistor, a highly reliable display device can be obtained.

REFERENCE SIGNS LIST 1 substrate
2 gate electrode
3 gate-insulating film
4 oxide semiconductor layer 5 source/drain electrode
6 protective film (insulating film)
7 contact hole
8 transparent conductive film

The invention claimed is:

1. A sputtering target for forming an oxide, the sputtering target comprising
In, Ga, and Zn; and
at least one element selected from the group X consisting of Si, Ni, Hf, Ta, and W,
wherein
the sputtering target does not comprise Sn,
when the sputtering target comprises Si as the element of the group X, Si/(In+Ga+Zn+Si)×100=2.0 to 15 at %;
when the sputtering target comprises Ni as the element of the group X, Ni/(In+Ga+Zn+Ni)×100=0.1 to 5 at %;
when the sputtering target comprises Hf as the element of the group X, Hf/(In+Ga+Zn+Hf)×100=2.0 to 10 at %;
when the sputtering target comprises Ta as the element of the group X, Ta/(In+Ga+Zn+Ta)×100=2.0 to 10 at %; and
when the sputtering target comprises W as the element of the group X, W/(In+Ga+Zn+W)×100=2.0 to 10 at %.

2. The sputtering target according to claim 1, comprising In, Ga, Zn, and Si,
wherein Si/(In+Ga+Zn+Si)×100=2.0 to 15 at %.

3. The sputtering target according to claim 1, comprising In, Ga, Zn, and Ni,
wherein Ni/(In+Ga+Zn+Ni)×100=0.1 to 5 at %.

4. The sputtering target according to claim 1, comprising In, Ga, Zn, and Hf,
wherein Hf/(In+Ga+Zn+Hf)×100=2.0 to 10 at %.

5. The sputtering target according to claim 1, comprising In, Ga, Zn, and Ta,
wherein Ta/(In+Ga+Zn+Ta)×100=2.0 to 10 at %.

6. The sputtering target according to claim 1, comprising In, Ga, Zn, and W,
wherein W/(In+Ga+Zn+W)×100=2.0 to 10 at %.

* * * * *